United States Patent
Kanai et al.

[11] Patent Number: 6,121,727
[45] Date of Patent: Sep. 19, 2000

[54] ORGANIC ELECTROLUMINESCENT DEVICE

[75] Inventors: Hiroyuki Kanai; Yoshiharu Sato, both of Yokohama, Japan

[73] Assignee: Mitsubishi Chemical Corporation, Tokyo, Japan

[21] Appl. No.: 09/053,694

[22] Filed: Apr. 2, 1998

[30] Foreign Application Priority Data

| Apr. 4, 1997 | [JP] | Japan | ................................. 9-086662 |
| Apr. 8, 1997 | [JP] | Japan | ................................. 9-089575 |
| May 7, 1997 | [JP] | Japan | ................................. 9-116893 |

[51] Int. Cl.$^7$ .................................................. H05B 33/22
[52] U.S. Cl. ........................................... 313/504; 315/506
[58] Field of Search ................................. 313/503, 504, 313/505, 506, 510; 428/690

[56] References Cited

U.S. PATENT DOCUMENTS

| 4,764,625 | 8/1988 | Turner et al. ............................. 548/442 |
| 4,923,774 | 5/1990 | Van der Auweraer et al. ........... 430/59 |
| 4,950,950 | 8/1990 | Perry et al. ............................... 313/504 |
| 5,445,899 | 8/1995 | Budzilek et al. ......................... 428/690 |
| 5,677,572 | 10/1997 | Hung et al. .............................. 257/750 |
| 5,739,635 | 4/1998 | Wakimoto ................................. 313/504 |
| 5,776,622 | 7/1998 | Hung et al. .............................. 428/690 |
| 5,776,623 | 7/1998 | Hung et al. .............................. 428/690 |

FOREIGN PATENT DOCUMENTS

| 0 740 489 | 10/1996 | European Pat. Off. ........ H05B 33/12 |
| 0 822 603 | 2/1998 | European Pat. Off. ........ H05B 33/26 |

OTHER PUBLICATIONS

Yoshihiko Mori, et al., Applied Physics, vol. 61, pp. 1044–1047, Preparation of Organic Electroluminescent Devices by Dipcoating, 1992 (with English Translation) (no month).

Shizuo Tokito, et al., Lecture Draft of the 43$^{rd}$ Lecture of Applied Physics Association, p. 1122, 27a–SY–9, "Organic El Devices With Metal Oxides as a Hole–Injecting Layer", 1996 (with English Translation) (no month).

Manabu Uchida, et al., Lecture Draft of The 70$^{th}$ Spring Annual Meeting of Japan Chemistry Association, 2D102 and 2D103, "Organic El Devices Using Silole Derivatives", 1996 (with English Translation) (no month).

C. W. Tang, et al., Appl. Phys. Lett., vol. 51, No. 12, pp. 913–915, Sep. 21, 1987, "Organic Electroluminescent Diodes".

Chihaya Adachi, et al., Appl Phys Lett., vol. 55, No. 15, pp. 1489–1491, Oct. 9, 1989, "Organic Electroluminescent Device Having a Hole Conductor as an Emitting Layer".

D. Braun, et al., Appl. Phys. Lett., vol. 58, No. 18, pp. 1982–1984, May 6, 1991, "Visible Light Emission from Semiconducting Polymer Diodes".

Junji Kido, et al., Appl. Phys. Lett., vol. 59, No. 21, pp. 2760–2762, Nov. 18, 1991, "Poly(methylphenylsilane) Film as a Hole Transport Layer in Electroluminescent Devices".

Yong Cao, et al., Appl. Phys. Lett., vol. 60, No. 22, pp. 2711–2713, Jun. 1, 1992, "Solution–Cast Films of Polyaniline: Optical–Quality Transparent Electrodes".

A. R. Brown, et al., Appl. Phys. Lett., vol. 61, No. 23, pp. 2793–2795, Dec. 7, 1992, "Poly(p–phenylenevinylene)Light–Emitting Diodes: Enhanced Electroluminescent Efficiency Through Charge Carrier Confinement".

(List continued on next page.)

Primary Examiner—Michael H. Day
Attorney, Agent, or Firm—Oblon, Spivak, McClelland, Maier & Neustadt, P.C.

[57] ABSTRACT

An organic electroluminescent device including an anode, an organic luminescent layer adjacent to the anode, a cathode interface layer adjacent to the organic luminescent layer and a cathode adjacent to the cathode interface layer. The cathode interface layer includes at least one compound selected from a halide of a metal of Group 3A of the Periodic Table, a halide of a metal of the lanthanide series of the Periodic Table, and a complex halide compound of at least two metal elements.

10 Claims, 7 Drawing Sheets

OTHER PUBLICATIONS

Y. Yang, et al., Appl. Phys. Lett., vol. 64, No. 10, pp. 1245–1247, Mar. 7, 1994, "Polyaniline as a Transparent Electrode for Polymer Light–Emitting Diodes: Lower Operation Voltage and Higher Efficiency".

L. S. Hung, et al., Appl. Phys. Lett., vol. 70, No. 2, pp. 152–154, Jan. 13, 1997, "Enhanced Electron Injection in Organic Electroluminescence Devices Using an AL/LIF Electrode".

F. Li, et al., Appl. Phys. Lett., vol. 70, No. 10, pp. 1233–1235, Mar. 10, 1997, "Fabrication and Electroluminescence of Double–Layered Organic Light–Emitting Diodes with the $Al_2O_3/Al$ Cathode".

C. W. Tang, et al., J. Appl. Phys., vol. 65, No. 9, pp. 3610–3616, May 1, 1989, "Electroluminescence of Doped Organic Thin Films".

D. Braun, et al., J. Appl. Phys., vol. 72, No. 2, pp. 564–568, Jul. 15, 1992, "Electroluminescence and Electrical Transport in Poly(3–octylthiophene) Diodes".

J. H. Burroughes, et al., Nature, vol. 347, pp. 539–541, Oct. 11, 1990, "Light–Emitting Diodes Based on Conjugated Polymers".

G. Gustafsson, et al., Nature, vol. 357, pp. 477–479, Jun. 11, 1992, "Flexible Light–Emitting Diodes Made from Soluble Conducting Polymers".

D. Braun, et al., Thin Solid Films, vol. 216, pp. 96–98, 1992, "Electroluminescence from Light–Emitting Diodes Fabricated from Conducting Polymers", (no month).

Yutaka Ohmori, et al., Japanese Journal Applied Physics, vol. 30, No. 11B, pp. L1938–L1940, Nov. 1991, Visible––Light Electroluminescent Diodes Utilizing Poly(3–alkylthiophene).

Milan Stolka, et al., Journal Polymer Science, Polymer Chemical Editoion, vol. 21, pp. 269–283, 1983, "Photoconductivity and Hole Transport in Polymers of Aromatic Amine–Containing Methacrylates", (no month).

P. M. Borsenberger, et al., Phys. Stat. Sol (a), vol. 142, pp. 489–497, 1994, "Electron Transport in 2–t–butyl–9, 10–N, N'–Dicyanoanthraquinonediimine", (no month).

A. Kraft, et al., Synthetic Metals, vol. 55–57, pp. 4163–4167, 1993, "Hole–Transporting Compounds for Multi–Layer Polymer Light–Emitting Diodes", (no month).

Database WPI, Derwent Publications, JP 59–194393, Nov. 5, 1984.

Database WPI, Derwent Publications, JP 2–311591, Dec. 27, 1990.

Database WPI, Derwent Publications, JP 3–269084, Nov. 29, 1991.

Database WPI, Derwent Publications, JP 4–129271, Apr. 30, 1992.

Database WPI, Derwent Publications, JP 4–175395, Jun. 23, 1992.

Database WPI, Derwent Publications, JP 4–264189, Sep. 18, 1992.

Database WPI, Derwent Publications, JP 4–290851, Oct. 15, 1992.

Database WPI, Derwent Publications, JP 4–304466, Oct. 27, 1992.

Database WPI, Derwent Publications, JP 4–308688, Oct. 30, 1992.

Database WPI, Derwent Publications, JP 4–364153, Dec. 16, 1992.

Database WPI, Derwent Publications, JP 5–025473, Feb. 2, 1993.

Database WPI, Derwent Publications, JP 5–159882, Jun. 25, 1993.

Database WPI, Derwent Publications, JP 5–198380, Aug. 6, 1993.

Database WPI, Derwent Publications, JP 5–234681, Sep. 10, 1993.

Database WPI, Derwent Publications, JP 5–239455, Sep. 17, 1993.

Database WPI, Derwent Publications, JP 5–320634, Dec. 3, 1993.

Database WPI, Derwent Publications, JP 6–001972, Jan. 11, 1994.

Database WPI, Derwent Publications, JP 6–049079, Feb. 22, 1994.

Database WPI, Derwent Publications, JP 6–025659, Feb. 1, 1994.

Database WPI, Derwent Publications, JP 5–310949, Nov. 22, 1993.

Database WPI, Derwent Publications, JP 7–053953, Feb. 28, 1995.

Database WPI, Derwent Publications, JP 7–138562, May 30, 1995.

Database WPI, Derwent Publications, JP 7–252474, Oct. 3, 1995.

ORGANIC ELECTROLUMINESCENT DEVICE

The present invention relates to an organic electroluminescent device. Particularly, it relates to a thin film type device which emits light when an electric field is applied to a luminescent layer comprising an organic compound.

Heretofore, it has been common that thin-film type electroluminescent (EL) devices are made of inorganic material which is obtained by doping a semiconductor of a Group II–VI compound such as ZnS, CaS, or SrS with Mn or a rare earth element (such as Eu, Ce, Tb, Sm) as the luminous center. However, the EL devices made of such inorganic materials, have the following problems:

1) Alternate current drive is required (50 to 1000 Hz),
2) The driving voltage is high (about 200 V),
3) It is difficult to obtain full coloring (particularly, blue color), and
4) Costs of peripheral driving circuits are high.

However, in order to overcome the above problems, there have been activities, in recent years, to develop EL devices using organic materials. Particularly, the luminous efficiency has been improved to a large extent over conventional EL devices employing a single crystal of e.g. anthracene, by the development of an organic EL device wherein the electrode material has been optimized for the purpose of improving the efficiency for carrier injection from the electrode in order to increase the luminous efficiency, and an organic hole transport layer made of an aromatic diamine and a luminescent layer made of an aluminum complex of 8-hydroxyquinoline, are provided (Appl. Phys. Lett., vol.51, p.913, 1987).

Further, for an organic luminescent layer, a polymer material such as poly(p-phenylenevinylene) (Nature, vol.347, p.539, 1990; Appl. Phys. Lett., vol.61, p.2793, 1992), poly[2-methoxy, 5-(2'-ethylhexoxy)-1,4-phenylenevinylene] (Appl. Phys. Lett., vol.58, p.1982, 1991; Thin Solid Films, vol.216, p.96, 1992; Nature, vol.357, p.477, 1992) or poly(3-alkylthiophene) (Jpn. J. Appl. Phys. Vol.30, L1938, 1991; J. Appl. Phys. Vol.72, p.564, 1992), has been developed, and a device having a luminescent material and an electrontransfer material mixed to a polymer such as polyvinyl carbazole, has been developed, (Applied Physics, vol.61, p.1044, 1992).

In such organic EL devices as described above, it is common that a transparent electrode such as indium tin oxide (ITO) is used as an anode, but for a cathode, a metal electrode having a low work function is employed to carry out the electron injection efficiently, therefore a magnesium alloy, calcium or the like is employed. Further, an alloy having from 0.01 to 0.1% of lithium doped on aluminum, is employed as a system having a trace amount of a low work function metal doped on a relatively stable metal (JP-A-5-159882, JP-A-5-198380).

Further, recently, there have been a report on an attempt to reduce the voltage of a device by vapor depositing lithium fluoride in a thickness of from 0.5 to 1 nm and further vapor depositing aluminum thereon (p152, Appl. Phys. Lett. 70(2), 1997) and a report on the results of a similar attempt to reduce the voltage of a device by vapor depositing aluminum in a thickness of from 0.6 to 1.2 nm, exposing it to atmospheric air to form $Al_2O_3$ by natural oxidation and further vapor depositing aluminum thereon (p1233, Appl. Phys. Lett. 70(10), 1997), but no report has been made with respect to stability of a device. Further, as a cathode interface layer, one employing an organic substance, such as one employing an N-phenylcarbazole compound (JP-A-6-199562) or one employing an aromatic amine compound (JP-A-5-48475), has been reported, but no adequate properties have been obtained. Thus, the developments have not yet reached a practical level from the viewpoint of presenting a device which is capable of emitting light stably.

With organic electroluminescent devices disclosed heretofore, EL emission is brought about by recombination of injected holes and electrons. In the case of electron injection, in order to improve the injection efficiency by reducing the injection barrier at the interface between the cathode and the organic luminescent layer. Therefore it is common to employ, as a cathode, a metal electrode having a low work function such as a magnesium alloy or calcium, or an electrode having trace amount of a metal having a low work function doped on a stable metal. However, such a metal material is poor in the adhesion to the organic luminescent layer, whereby it tends to be peeled off the organic luminescent layer, or deterioration in the properties of the device is likely to be brought about by oxidation of the cathode material or by diffusion of the cathode material into the organic luminescent layer.

Under these circumstances, the present inventors have conducted extensive studies for the purpose of presenting an organic electroluminescent device which is capable of maintaining a stable emission characteristics over a long period of time, and as a result, they have found it effective to provide a cathode interface layer containing a certain specific metal compound at the interface between the organic luminescent layer and the cathode.

Thus, the present invention provides an organic electroluminescent device having an organic luminescent layer interposed between an anode and a cathode, on a substrate, wherein a cathode interface layer comprising a specific metal compound, is formed between the cathode and the organic luminescent layer of the device. Specifically, it provides an organic luminescent device, wherein a cathode interface layer comprising at least one compound selected from a halide of a metal of Group 2A of the Periodic Table, a halide of a metal of Group 3A of the Periodic Table and a complex halide compound of at least two metal elements, is formed.

Now, the organic electroluminescent device of the present invention will be described with reference to the accompanying drawings in which.

Figure 1:
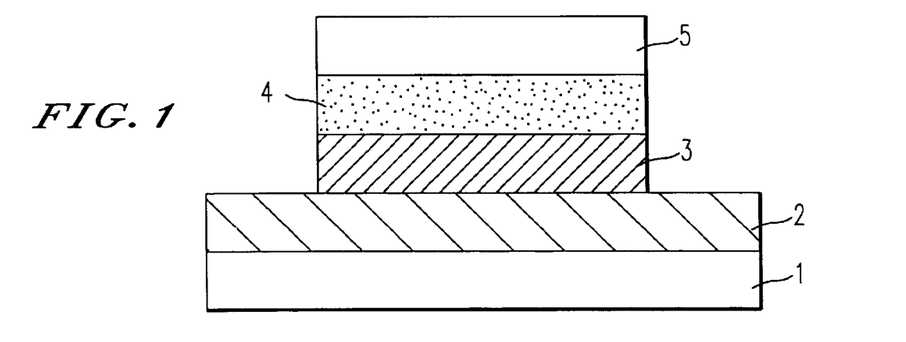
FIG. 1 is a schematic cross-sectional view illustrating an embodiment of the organic electroluminescent device.

FIG. 1 is a cross-sectional view schematically illustrating the structural embodiment of a common organic electroluminescent device employed in the present invention, wherein reference numeral 1 indicates a substrate, numeral 2 an anode, numeral 3 an organic luminescent layer, numeral 4 a cathode interface layer, and numeral 5 a cathode.

The substrate 1 is a support for the organic electroluminescent device, and may, for example, be a quartz or glass sheet, a metal sheet or foil, or a plastic film or sheet. Particularly preferred is a glass sheet or a sheet of a transparent synthetic resin such as polyester, polymetacrylate, polycarbonate or polysulfone. When a synthetic resin substrate is used, it is necessary to pay an attention to a gas barrier property. If the gas barrier property of the substrate is too low, the organic electroluminescent device is likely to deteriorate due to an exterior gas which permeates the substrate, such being undesirable. Accordingly, it is one of preferred methods to provide a dense silicon oxide film on one side or each side of a synthetic resin substrate to secure the gas barrier property.

An anode 2 is formed on the substrate 1. The anode 2 plays a role of hole injection into the organic luminescent layer 3. This anode is made usually of a metal such as aluminum, gold, silver, nickel, palladium or platinum, a metal oxide such as indium and/or tin oxide, a metal halide such as copper iodide, carbon black, or an electroconductive polymer such as poly(3-methylthiophene), polypyrrole or polyaniline. Formation of the anode 2 is carried out usually by e.g. sputtering or vacuum vapor deposition, in many cases. Further, in the case of fine particles of a metal such as silver, fine particles of e.g. copper iodide, carbon black, fine particles of an electroconductive metal oxide or a fine powder of an electroconductive polymer, such a material may be dispersed in a suitable binder resin solution, followed by coating on the substrate 1 to form the anode 2. Further, in the case of an electroconductive polymer, a thin film may directly be formed on the substrate 1 by electrolytic polymerization (Appl. Phys. Lett., vol.60, p.2711, 1992). The anode 2 may be formed by laminating different materials. The thickness of the anode 2 varies depending upon the required transparency. In a case where transparency is required, it is usually preferred that the transmittance of visible light is usually at least 60%, preferably at least 80%. In such a case, the thickness is usually from 5 to 1000 nm, preferably from 10 to 500 nm. In a case where it may be opaque, the anode 2 may be made by the same material as the substrate 1. Further, on the above described anode 2, a different electroconductive material may be laminated.

Figure 2:
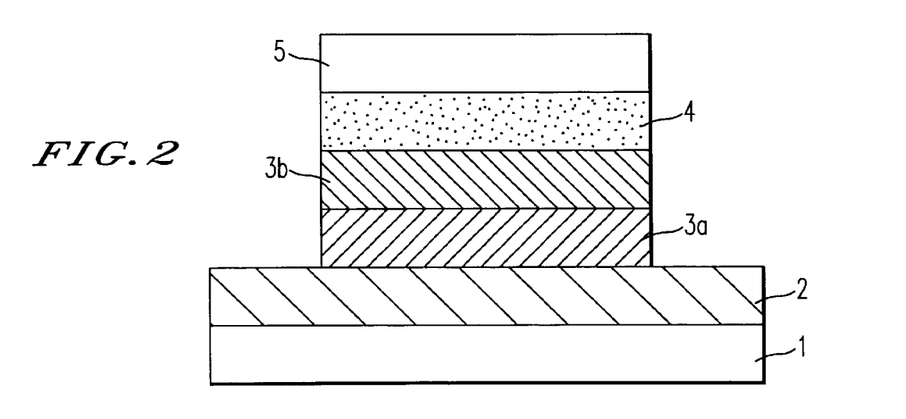
FIG. 2 is a schematic cross-sectional view illustrating another embodiment of the organic electroluminescent device.

On the anode 2, an organic luminescent layer 3 is formed. The organic luminescent layer 3 is made of a material which is capable of efficiently transporting holes injected from the anode and electrons injected from the cathode and efficiently emitting light by recombination of both carrier. This organic luminescent layer 3 is usually divided into a hole transport layer 3a and an electron transport layer 3b to form a function separation type, as shown in FIG. 2, in order to improve the luminous efficiency (Appl. Phys. Lett., vol.51, p.913, 1987).

In the above function separation type device, the material for the hole transport layer 3a is required to be a material which has high efficiency for injecting holes from the anode 2 and which is capable of efficiently transporting the injected holes. For this purpose, it is required that the ionization potential is small, transparency to visible light is high, yet, the hole mobility is large and excellent in stability, and impurities constituting traps are less likely to form during the production or during use. In addition to such general requirements, the device is further required to have thermal stability, when its application to a display on a vehicle is taken into account. Accordingly, a material having a glass transition temperature of at least 70° C., is preferred.

Such a hole transport material may, for example, be an aromatic diamine compound having tertiary aromatic amine units of e.g. 1,1-bis(4-di-p-tolylaminophenyl)cyclohexane connected thereto (JP-A-59-194393), an aromatic amine containing at least two tertiary amines represented by 4,4'-bis[N-(l-naphtyl)-N-phenylamino]biphenyl and having at least two condensed aromatic rings substituted on a nitrogen atom (JP-A-5-234681), an aromatic triamine which is a triphenylbenzene derivative and which has a star burst structure (U.S. Pat. No. 4,923,774), an aromatic diamine such as N,N'-diphenyl-N,N'-bis(3-methylphenyl)biphenyl-4,4'-diamine (U.S. Pat. No. 4,764,625), α, α, α', α'-tetramethyl-α,α'-bis(4-di-p-tolylaminophenyl)-p-xylene (JP-A-3-269084), a triphenylamine derivative which is sterically asymmetrical as a whole molecule (JP-A-4-129271), a compound having a plurality of aromatic diamino groups substituted on a pyrenyl group (JP-A-4-175395), an aromatic diamine having tertiary aromatic amine units connected by ethylene groups (JP-A-4-264189), an aromatic diamine having a stylyl structure (JP-A-4-290851), one having aromatic tertiary amine units connected by thiophene groups (JP-A-4-304466), a star burst type aromatic triamine (JP-A-4-308688), a benzylphenyl compound (JP-A-4-364153), one having tertiary amines connected by fluorene groups (JP-A-5-25473), a triamine compound (JP-A-5-239455), bisdipyridylamino biphenyl (JP-A-5-320634), an N,N,N-triphenylamine derivative (JP-A-6-1972), an aromatic diamine having a phenoxadine structure (JP-A-7-138562), a diaminophenylphenanetrizine derivative (JP-A-7-252474), a hydrazone compound (JP-A-2-311591), a silazane compound (U.S. Pat. No. 4,950,950), a silanamine derivative (JP-A-6-49079), a phosphamine derivative (JP-A-6-25659), or a quinacridone compound. These compounds may be used alone or in combination as a mixture, as the case requires.

In addition to the above compounds, the material for the hole transport layer may, for example, be a polymer material such as a polyvinyl carbazole or polysilane (Appl. Phys. Lett., vol.59, p.2760, 1991), polyphosphazene (JP-A-5-310949), polyamide (JP-A-5-310949), polyvinyl triphenylamine (JP-A-7-53953), a polymer having a triphenylamine structure (JP-A-4-133065), a polymer having triphenylamine units connected by methylene groups (Synthetic Metals, vol.55–57, p.4163, 1993), or a polymetacrylate containing an aromatic amine (J. Polym. Sci., Polym. Chem. Ed., vol.21, p.969, 1983).

The above hole transport material is laminated on the above anode 2 by a coating method or a vacuum vapor deposition method to form a hole transport layer 3a.

In the case of the coating method, one or more hole transport materials and, if necessary, a binder resin which is free from hole traps, or an additive such as an agent for improving the coating property, are added and dissolved to obtain a coating solution, which is then coated on the anode 2 by a method such as a spin coating method, followed by drying to form a hole transport layer 3a. The binder resin may, for example, be polycarbonate, polyarylate or polyester. The amount of the binder resin should better be small, and usually preferably at most 50 wt %, since if the amount is large, the hole mobility tends to be low.

In the case of the vacuum vapor deposition, the hole transport material is put in a crucible set in a vacuum chamber, and the interior of the vacuum chamber is evacuated by a suitable vacuum pump to a level of about $10^{-4}$ Pa, and then the crucible is heated to evaporate the hole transport material and thereby to form a hole transport layer on the anode 2 on the substrate 1 placed face to face against the crucible.

The thickness of the hole transport layer 3a is usually from 10 to 300 nm, preferably from 30 to 100 nm. To form such a thin film uniformly, it is usually common to employ the vacuum vapor deposition method.

Figure 3:
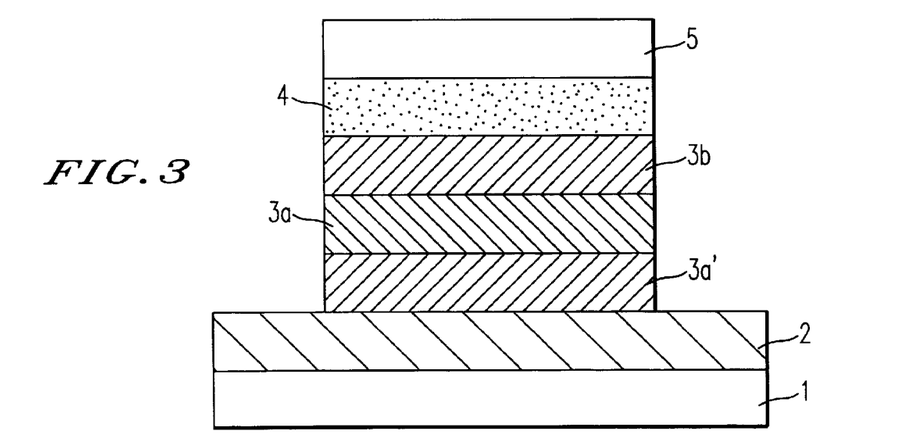
FIG. 3 is a schematic cross-sectional view illustrating still another embodiment of the organic electroluminescent device.

To improve the contact between the anode 2 and the hole transport layer 3a, an anode buffer layer 3a' may be formed between the anode and the hole transport layer. The material to be used for the anode buffer layer is required to have good contact with the anode, to be able to form a uniform thin film, to be thermally stable i.e. to have a high melting point and a high glass transition temperature, the melting point being at a level of at least 300° C., and the glass transition temperature being at least 100° C. Further, it is required that the ionization potential is low, the hole injection from the anode is easy, and the hole mobility is large. For this purpose, an organic compound such as a porphyrin derivative or a phthalocyanine compound (JP-A-63-295695), a star burst type aromatic triamine (JP-A-4-308688), a hydrazone compound (JP-A-4-320483), an alkoxy-substituted aromatic diamine derivative (JP-A-4-220995), p-(9-anthryl)-N,N-di-p-tolylaniline (JP-A-3-111485), polythienylenevinylene or poly-p-phenylenevinylene (JP-A-4-145192), or polyaniline (Appl. Phys. Lett., vol.64, p.1245, 1994), a sputtered carbon film (JP-A-8-31573), or a metal oxide such as vanadium oxide, ruthenium oxide or molybdenum oxide (43th lecture meeting of Applied Physics Related Association, 27a-SY-9, 1996) has heretofore been reported.

A porphyrin compound or a phthalocyanine compound may be mentioned as a compound which is frequently used as a material for the above anode buffer layer. Such a compound may or may not have a center metal.

The following compounds may be mentioned as specific examples of such preferred compounds:

Porphine
5,10,15,20-tetraphenyl-21H,23H-porphine
5,10,15,20-tetraphenyl-21H,23H-porphine cobalt(II),
5,10,15,20-tetraphenyl-21H,23H-porphine copper(II),
5,10,15,20-tetraphenyl-21H,23H-porphine zinc(II),
5,10,15,20-tetraphenyl-21H,23H-porphine vanadium(IV) oxide
5,10,15,20-tetra(4-pyrydyl)-21H,23H-porphine
29H,31H-phthalocyanine
Copper(II) phthalocyanine
Zinc(II) phthalocyanine
Titanium phthalocyanineoxide
Magnesium phthalocyanine
Lead phthalocyanine
Copper(II)4,4',4'',4'''-tetraaza-29H,31H-phthalocyanine Also in the case of the anode buffer layer, a thin film may be formed in the same manner as for the hole transport layer. However, in the case of an inorganic material, a sputtering method, an electron beam vapor deposition method or a plasma CVD method may further be employed.

The thickness of the anode buffer layer 3a' to be formed as described above, is usually from 3 to 100 nm, preferably from 10 to 50 nm.

On the hole transport layer 3a, an electron transport layer 3b is formed. The electron transport layer is formed by a compound which is capable of efficiently transporting electrons from a cathode in the direction of the hole transport layer 3a between electrodes to which an electric field is applied.

The electron transporting compound to be used for the electron transport layer 3b is required to be a compound which has a high efficiency for electron injection from the cathode 4 and which is capable of efficiently transporting the injected electrons. For this purpose, it is required to be a compound which has a large electron affinity and whereby the electron mobility is large and excellent in stability, and impurities which are likely to constitute traps, are scarcely formed during the production or during use.

As a material satisfying such conditions, an aromatic compound such as tetraphenylbutadiene (JP-A-57-51781), a metal complex such as an aluminum complex of 8-hydroxyquinoline (JP-A-59-194393), a metal complex of 10-hydroxybenzo[h]quinoline (JP-A-6-322362), a mixed ligand aluminum chelate complex (JP-A-5-198377, JP-A-5-198378, JP-A-5-214332, JP-A-6-172751), a cyclopentadiene derivative (JP-A-2-289675), a perinone derivative (JP-A-2-289676), an oxadiazole derivative (JP-A-2-216791), a bisstylylbenzene derivative (JP-A-1-245087, JP-A-2-222484), a perylene derivative (JP-A-2-189890, JP-A-3-791), a cumarin compound (JP-A-2-191694, JP-A-3-792), a rare earth complex (JP-A-1-256584), a distylylpyradine derivative (JP-A-2-252793), a p-phenylene compound (JP-A-3-33183), a thiadiazolopyridine derivative (JP-A-3- 37292), a pyrrolopyridine derivative (JP-A-3-37293), a naphthylidine derivative (JP-A-3-203982), or a silol derivative (70th spring annual meeting of Japan Chemical Association, 2D1 02 and 2D1 03, 1996), may, for example, be mentioned.

The thickness of the electron transport layer 3b is usually from 10 to 200 nm, preferably from 30 to 100 nm. The electron transport layer may be formed by the same method as the hole transport layer, but a vacuum vapor deposition method is usually employed.

For the purpose of changing the luminescent color at the same time as improving the luminous efficiency of the device, it has been proposed to dope a fluorescent dye for laser, such as coumarin, using e.g. an aluminum complex of 8-hydroxyquinoline as the host material (J. Appl. Phys. vol.65, p.3610, 1989). This method has the following merits:

1) The luminous efficiency is improved by the highly efficient fluorescent dye.
2) The luminescent wavelength can be changed by the selection of the fluorescent dye.
3) It is possible to use a fluorescent dye which undergoes quenching.
4) A fluorescent dye having a poor thin film forming property may also be used.

Also for the purpose of improving the driving life of the device, it is effective to dope a fluorescent dye using the above electron transporting material as the host material. For example, it is possible to substantially improve the luminescence characteristic, particularly the driving stability, of the device by doping from 0.1 to 10 wt %, based on the host material, of a naphthacene derivative represented by rubrene (JP-A-4-335087), a quinacridone derivative (JP-A-5-70773) or a condensed polycyclic aromatic ring such as perylene (JP-A-5-198377), using a metal complex such as an aluminum complex of 8-hydroxyquinoline as the host material.

As the host material, when the electron transport layer 3b plays its role, the above electron transporting compound may be mentioned, and when the hole transport layer 3a plays a role as a host material, the above mentioned aromatic amine compound or a hydrazone compound may be mentioned.

When the above dopant is doped into the hole transport layer and/or the electron transport layer, it is uniformly doped in a direction perpendicular to the film in each layer, but there may be a concentration distribution in the vertical direction. For example, it may be doped only in the vicinity of the interface with the hole transport layer or in the vicinity of the cathode interface.

The electron transport layer 3b employing such a compound performs a role of transporting electrons and a role of bringing luminescence at the time of the recombination of the holes and the electrons, simultaneously.

When the hole transport layer 3a has a luminescent function, the electron transport layer 3b performs only a role of transporting electrons.

As a method for further improving the luminous efficiency of an organic electroluminescent device, an electron injection layer may further be laminated on the electron transport layer 3b, as an organic luminescent layer. The compound to be used for this electron injection layer is required to be such that electron injection from the cathode is easy, and the ability of transporting electrons is larger. As such an electron transporting material, an aluminum complex of 8-hydroxyquinoline or an oxadiazole derivative, which has already been mentioned as a material for the electron transport layer (Appl. Phys. Lett., vol.55, p.1489, 1989, etc.), a system having such a material dispersed in a resin such as poly(methyl metacrylate) (PMMA), a phenanethroline derivative (JP-A-5-331459), 2-t-butyl-9,10-N,N'-dicyanoanthraquinonediimine (Phys. Stat. Sol. (a), vol.142, p.489, 1994), n-type hydrogenated amorphous silicon carbide, n-type zinc sulfide, or n-type zinc selenide, may, for example, be mentioned. The thickness of the electron injection layer is usually from 5 to 200 nm, preferably from 10 to 100 nm.

As the material for a single layer type organic luminescent layer 3 wherein no function division is carried out, the above mentioned polymer material, such as poly(p-phenylenevinylene) (Nature, vol.347, p.539, 1990; Appl. Phys. Lett., vol.61, p.2793, 1992), poly[2-methoxy-5-(2'-ethylhexoxy)-1,4-phenylenevinylene] (Appl. Phys. Lett., vol.58, p.1982, 1991; Thin Solid Films, vol.216, p.96, 1992; Nature, vol.357, p.477, 1992), or poly(3-alkylthiophene) (Jpn. J. Appl. Phys., vol.30, L1938, 1991; J. Appl. Phys., vol.72, p.564, 1992), or a system having a fluorescent material and an electron transporting material mixed to a polymer such as polyvinyl carbazole (Applied Physics, vol.61, p.1044, 1992), may be mentioned.

In the present invention, a cathode interface layer is formed between the cathode and the organic fluorescent layer.

The cathode interface layer 4 performs a role of improving the adhesion between the cathode and the above organic fluorescent layer and preventing diffusion of the cathode material into the organic fluorescent layer. Further, it is required not to prevent injection of electrons from the cathode. The cathode interface layer of the present invention comprises at least one compound selected from a halide of a metal of Group 2A of the Periodic Table, a halide of a metal of Group 3A of the Periodic Table and a complex halide compound having at least two metal elements as constituting elements.

The metal of Group 2A of the Periodic Table contained in the cathode interface layer of the present invention, may, for example, be beryllium, magnesium, calcium, strontium, barium or radium. Preferred is magnesium, calcium, strontium or barium.

Further, the halogen means five elements i.e. fluorine, chlorine, bromine, iodine and astatine. However, the halide to be used in the present invention is preferably a fluoride, a chloride, a bromide or an iodide.

Specifically, preferred halides include calcium fluoride, magnesium fluoride, strontium fluoride, barium fluoride, calcium chloride, magnesium chloride, strontium chloride, barium chloride, calcium bromide, magnesium bromide, strontium bromide and barium bromide. Particularly preferred are magnesium fluoride, calcium fluoride, strontium fluoride and barium fluoride. These halides may be used as a mixture of two or more of them.

The metal of Group 3A of the Periodic Table contained in the cathode interface layer of the present invention, may, for example, be scandium, yttrium, a lanthanide (lanthanum, cerium, praseodymium, neodymium, prometium, samarium, europium, gadolinium, terbium, dysprosium, holmium, erbium, thulium, ytterbium or lutetium), or actinide, may, for example, be mentioned. However, preferred is scandium, yttrium, lanthanum, cerium, praseodymium, neodymium, samarium, europium, tellubium, dysprosium, thulium, ytterbium or lutetium.

Specifically, particularly preferred halides include scandium fluoride, yttrium fluoride, lanthanum fluoride, cerium fluoride, praseodymium fluoride, neodymium fluoride, samarium fluoride, europium fluoride, tellubium fluoride, dysprosium fluoride, thulium fluoride, ytterbium fluoride, lutetium fluoride, scandium chloride, yttrium chloride, lanthanum chloride, cerium chloride, praseodymium chloride, neodymium chloride, samarium chloride, europium chloride, tellubium chloride, dysprosium chloride, thulium chloride, ytterbium chloride, lutetium chloride, scandium bromide, yttrium bromide, lanthanum bromide, cerium bromide, praseodymium bromide, neodymium bromide, samarium bromide, europium bromide, tellubium bromide, dysprosium bromide, thulium bromide, ytterbium bromide and lutetium bromide. Particularly preferably, metal halides are scandium fluoride, yttrium fluoride, lanthanum fluoride, cerium fluoride, praseodymium fluoride, neodymium fluoride, samarium fluoride, europium fluoride, tellubium fluoride, dysprosium fluoride, thulium fluoride, ytterbium fluoride and lutetium fluoride, and these halides may be used as a mixture of two or more of them.

In the complex halide compound of at least two metal elements, contained in the cathode interface layer of the present invention, the metal elements are preferably at least two metal elements selected from metal elements of Groups 1A, 2A, 3A, 4A, 5A, 1B, 2B, 3B and 4B. More preferably, a complex halide compound represented by the following compositional formula may be mentioned:

$$A_p M_q X_r$$

wherein A is at least one element selected from metal elements of Groups 1A and 2A of the Periodic Table, M is at least one element selected from metal elements of Groups 3A and 3B, preferably aluminum gallium, indium or a lanthanide metal, and as A and M, two or more metal elements may respectively be used, and X is a halogen atom, preferably fluorine, chlorine, bromine or iodine, particularly preferably fluorine, and each of p, q and r which are independent of one another, is an integer of from 1 to 20.

Specifically, preferred complex halide compounds include, for example, $Na_3AlF_6$, $Na_5Al_3F_{14}$, $Na_3Li_3(AlF_6)_{12}$, $NaCaAlF_6$, $NaSr_3Al_3F_{16}$, $Na_2MgAlF_7$, $NaCaAlF_6$, $Na_3AlBr_6$, $Na_5Al_3Br_{14}$, $Na_3Li_3(AlBr_6)_{12}$, $NaCaAlBr_6$, $NaSr_3Al_3Br_{16}$, $Na_2MgAlBr_7$, $NaCaAlBr_6$, $Na_3AlCl_6$, $Na_5Al_3Cl_{14}$, $Na_3li_3(AlCl_6)_2$, $NaCaAlCl_6$, $NaSr_3Al_3Cl_{16}$, $Na_2MgAlCl_7$, $NaCaAlCl_6$, $Na_3Ali_6$, $Na_5Al_3I_{14}$, $Na_3Li_3(AlI_6)_2$, $NaCaAlI_6$, $NaSr_3Al_3I_{16}$, $Na_2MgAlI_7$, $NaCaAlI_6$, $Li_3AlF_6$, $Li_5Al_3F_{14}$, $LiCaAlF_6$, $LiSr_3Al_3F_{16}$, $Li_2MgAlF_7$, $LiCaAlF_6$, $Li_3AlBr_6$, $Li_5Al_3Br_{14}$, $LiCaAlBr_6$, $LiSr_3Al_3Br_{16}$, $Li_2MgAlBr_7$, $LiCaAlBr_6$, $Li_3AlCl_6$, $Li_5Al_3Cl_{14}$, $LiCaAlCl_6$, $LiSr_3Al_3Cl_{16}$, $Li_2MgAlCl_7$, $LiCaAlCl_6$, $Li_3AlI_6$, $Li_5Al_3I_{14}$, $LiCaaI_{16}$, $LiSr_3Al_3I_{16}$, $Li_2MgAlI_7$, $LiCaAlI_6$, $K_3AlF_6$, $K_5Al_3F_{14}$, $K_3Li_3(AlF_6)_{12}$, $KCaAlF_6$, $KSr_3Al_3F_{16}$, $K_2MgAlF_7$, $KCaAlF_6$, $K_3AlBr_6$, $K_5Al_3Br_{14}$, $K_3Li_3(AlBr_6)_{12}$, $KCaAlBr_6$, $KSr_3Al_3Br_{16}$, $K_2MgAlBr_7$, $KCaAlBr_6$, $K_3AlCl_6$, $K_5Al_3Cl_{14}$, $K_3Li_3(AlCl_6)_2$, $KCaAlCl_6$, $KSr_3Al_3Cl_{16}$, $K_2MgAlCl_7$, $KCaAlCl_6$, $K_3AlI_6$, $K_5Al_3I_{14}$, $K_3Li_3(AlI_6)_2$, $KCaAlI_{16}$, $KSr_3Al_3I_{16}$, $K_2MgAlI_7$, $KCaAlI_6$, $Na_3InF_6$, $Na_5In_3F_{14}$, $Na_3Li_3(InF_6)_{12}$, $NaCaInF_6$, $NaSr_3In_3F_{16}$, $Na_2MgInF_7$, $NaCaInF_6$, $Na_3InBr_6$, $Na_5In_3Br_{16}$, $Na_2MgInBr_7$, $NaCaInBr_6$, $Na_3InCl_6$, $Na_5In_3Cl_{14}$, $Na_3Li_3(InCl_6)_2$, $NaCaInCl_6$, $NaSr_3In_3Cl_{16}$, $Na_2MgInCl_7$, $NaCaInCl_6$, $Na_3InI_6$, $Na_5In_3I_{14}$, $Na_3Li_3(InI_6)_2$, $NaCaIn_{16}$, $NaSr_3In_3I_{16}$, $Na_2MgInI_7$, $NaCaInI_6$, $K_3InF_6$, $K_5In_3F_{14}$, $K_3Li_3(InF_6)_{12}$, $KCaInF_6$, $KSr_3In_3F_{16}$, $K_2MgInF_7$, $KCaInF_6$, $K_3InBr_6$, $K_5In_3Br_{14}$, $K_3Li_3(InBr_6)_{12}$, $KCaInBr_6$, $KSr_3In_3Br_{16}$, $K_2MgInBr_7$, $KCaInBr_6$, $K_3InCl_6$, $K_5In_3Cl_{14}$, $K_3Li_3(InCl_6)_2$, $KCaInCl_6$, $KSr_3In_3Cl_{16}$, $K_2MgInCl_7$, $KCaInCl_6$, $K_3InI_6$, $K_5In_3I_{14}$, $K_3Li_3(InI_6)_2$, $KCaIn_{16}$, $KSr_3In_3I_{16}$, $K_2MgInI_7$, $KCaInI_6$, $Na_2PrF_6$, $K_2PrF_6$, $Na_2CeF_6$, $K_2CeF_6$, $Na_2NdF_6$, $KNdF_6$, $Na_2LaF_6$, $K_2LaF_6$, $Na_2SmF_6$, $K_2SmF_5$, $Na_2EuF_6$, $K_2EuF_6$, $Na_2TbF_6$, $K_2TbF_6$, $Na_2GdF_6$, and $K_2GdF_5$ These compounds may be used as a mixture of two or more of them.

The thickness of the cathode interface layer is usually from 0.2 to 30 nm, preferably from 0.2 to 20 nm, more preferably from 0.2 to 10 nm.

The cathode 5 performs a role of injecting electrons into the organic luminescent layer. The material to be used for the cathode may be a material to be used for the above anode. However, to carry out the electron injection efficiently, it is preferably a metal having a low work function, particularly a metal with 4.7 eV or less. Such a material may, for example, be a metal such as tin, magnesium, indium, calcium, aluminum or silver, or an alloy containing such a metal as the main component. Amount them, silver, magnesium, aluminum, indium or an alloy containing such a metal as the main component, is preferred. Otherwise, it is possible to employ a cathode having a trace amount of a metal having a low work function doped on a relatively stable metal. Such a cathode may, for example, be a metal film having from 0.01 to 0.1% of lithium doped on aluminum or indium (JP-A-5-159882, JP-A-5-198380).

The thickness of the cathode 5 is usually from 0.1 nm to 10 μm, preferably from 0.2 nm to 2 μm.

Figure 4:
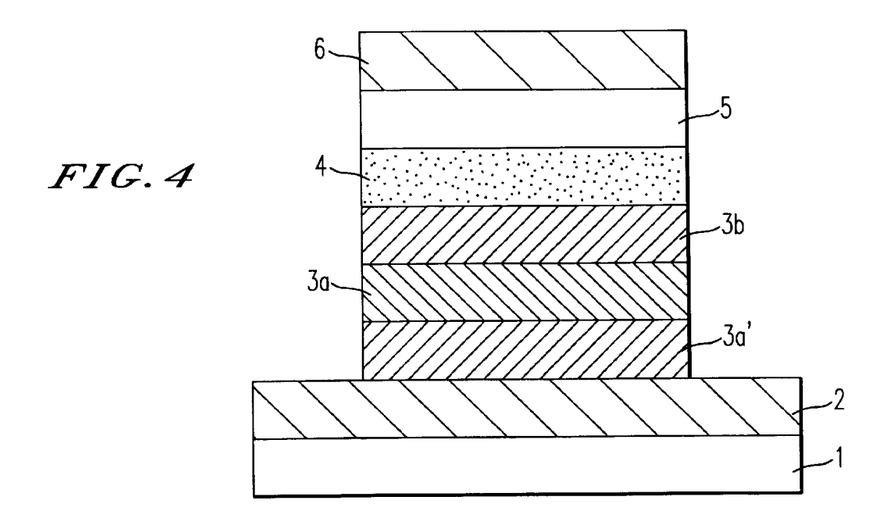
FIG. 4 is a schematic cross-sectional view illustrating a further embodiment of the organic electroluminescent device.

The cathode may have a multilayer structure comprising at least two layers. For example, as shown in FIG. 4, it is effective to form an electric resistance-reduced layer 6 employing a metal having an electrical resistivity of not higher than 10 μΩ.cm on a cathode 5 having a work function of not higher than 4.7 eV in order to reduce the wiring resistance of the device. In general, an organic electroluminescent device is a current-controlling type device, and when integrated, it is accordingly likely to have a problem of a voltage drop due to the wiring resistance. To avoid such a problem, it is common to adopt a method of increasing the thickness of the cathode, or a method of employing a material having a low electrical resistivity. However, the method of increasing the thickness is not desirable from the viewpoint of the process, and a copper or the like having a low electrical resistivity has a high work function and thus can not be used as a cathode material. By laminating the above mentioned electrical resistance-reduced layer, it becomes possible to reduce the thickness of the metal layer which is in contact with the cathode interface layer.

In a case where this structure is employed, the thickness of the cathode 5 may be at the same level as the above-mentioned cathode thickness and is usually from 0.1 nm to 10 μm, preferably from 0.2 nm to 2 μm, more preferably from 0.2 to 20 nm. The thickness of the electrical resistance-reduced layer 6 is usually from 20 nm to 10 μm, preferably from 30 nm to 2 μm. For the electrical resistance-reduced layer, a metal having an electrical resistivity of not higher than 10 μΩ.cm is employed. Specifically, aluminum, copper, silver or gold may, for example, be mentioned.

Figure 5:
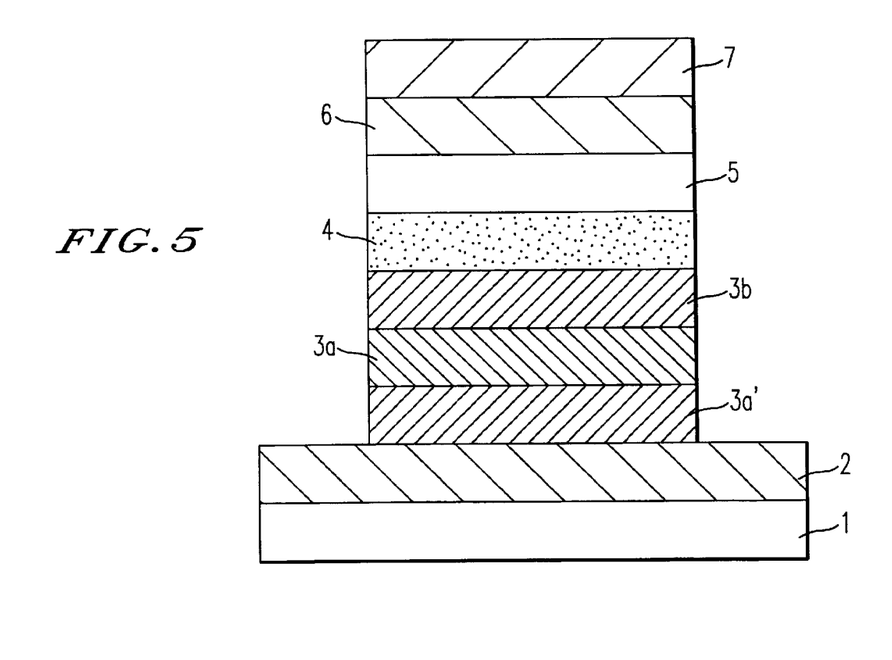
FIG. 5 is a schematic cross-sectional view illustrating a still further embodiment of the organic electroluminescent device.

Furthermore, as shown in FIG. 5, it is possible to form a protective film layer 7 on the electrical resistance-reduced layer 6. Namely, for the purpose of protecting the cathode made of a metal having a low work function, a metal layer is laminated thereon, as a protective layer which has a high work function and is stable against atmospheric air, whereby the stability of the device is increased. For this purpose, a metal such as aluminum, silver, nickel, chromium, gold or platinum may be used.

Further, it is also possible to adopt a laminated structure in a reverse order of FIG. 1, i.e. the lamination is carried out in the order of the cathode 5, the cathode interface layer 4, the organic luminescent layer 3 and the anode 2, on the substrate. As mentioned above, it is also possible to provide the organic electroluminescent device of the present invention between a pair of substrates, at least one of which has high transparency. Likewise, it is also possible to carry out lamination in a reverse order of each of the layered structures shown in FIGS. 2 to 5.

Now, the present invention will be described in further detail with reference to Examples. However, it should be understood that the present invention is by no means restricted to such specific Examples.

EXAMPLE 1

An organic electroluminescent device having the structure shown in FIG. 3, was prepared by the following method.

A glass substrate having a transparent electroconductive film of indium tin oxide (ITO) laminated in a thickness of 120 nm thereon, was subjected to patterning to form a stripe having a width of 2 μm by means of a conventional photolithographic technique and etching with hydrochloric acid, to form an anode. This pattern-formed substrate was washed sequentially in the order of supersonic washing with acetone, washing with pure water and supersonic washing with isopropyl alcohol, then dried by blowing nitrogen and finally subjected to ultraviolet ray ozone cleaning, and then it was set in a vacuum vapor deposition apparatus. The apparatus was preliminarily evacuated by an oil-sealed rotary vacuum pump and then evacuated by an oil diffusion pump equipped with a liquid nitrogen trap until the vacuum degree in the apparatus became not higher than $2\times10^{-6}$ Torr (about $2.7\times10^{-4}$ Pa).

Copper phthalocyanine having the following structural formula:

was put into a boat placed in the above apparatus, and the boat was heated to carry out vapor deposition. During the vapor deposition, the vacuum degree was $2.8\times10^{-6}$ Torr (about $3.7\times10^{-4}$ Pa), and an anode buffer layer 3a' having a thickness of 20 nm was obtained at a vapor deposition rate of 0.2 nm/sec.

Then, 4,4'-bis[N-(1-naphthyl)-N-phenylamino]biphenyl of the following formula:

was put into a ceramic crucible placed in the above apparatus, and the crucible was heated by a tantalum heater to carry out vapor deposition. At that time, the temperature of the crucible was controlled within a range of from 220 to 240° C. During the vapor deposition, the vacuum degree was $2.8\times10^{-6}$ Torr (about $3.7\times10^{-4}$ Pa), and a hole transport layer 3a having a thickness of 60 nm was formed at a vapor deposition rate of 0.4 nm/sec.

Then, as a material for the electron transport layer 3b, a 8-hydroxyquinoline complex of aluminum, $Al(C_9H_6NO)_3$ of the following structural formula:

was vapor-deposited in the same manner as in the case of the hole transport layer. At that time, the crucible temperature of the 8-hydroxyquinoline complex of aluminum was con-trolled within a range of from 275 to 285° C. During the vapor deposition, the vacuum degree was $2.5\times10^{-6}$ Torr (about $3.3\times10^{-4}$ Pa), the vapor deposition rate was from 0.3 to 0.4 nm/sec, and the thickness of the vapor deposited electron transport layer was 75 nm.

The substrate temperature was maintained at room temperature, during the above vacuum vapor deposition of the hole transport layer 3a and the electron transport layer 3b.

Then, the device subjected to vapor deposition of up to the electron transport layer 3b, was once taken out from the above vacuum vapor deposition apparatus to the atmospheric air, and a shadow mask in a stripe shape having a width of 2 mm was intimately placed as a mask for cathode vapor deposition on the device so that it crossed the ITO stripe of the anode 2. The masked device was placed in another vacuum vapor deposition apparatus, which was evacuated in the same manner as for the organic layer until the vacuum degree in the apparatus became not higher than $2\times10^{-6}$ Torr (about $2.7\times10^{-4}$ Pa). Then, as a cathode interface layer, magnesium fluoride was vapor-deposited by means of a molybdenum boat so that the film thickness would be 0.5 nm. During the vapor deposition, the vacuum degree was $4\times10^{-6}$ Torr (about $5.3\times10^{-4}$ Pa).

Further, aluminum was vapor-deposited thereon as a cathode in a thickness of 150 nm by means of a molybdenum boat. The vacuum degree during the vapor deposition of aluminum was $1.5\times10^{-5}$ Torr (about $2.0\times10^{-2}$ Pa), and the vapor deposition time was two minutes.

As described above, an organic electroluminescent device having a luminous layer portion with a size of 2 mm×2 mm, was obtained. A direct current voltage was applied to this device by setting the anode to have positive polarity and the cathode to have negative polarity, whereby at 3 V, the luminance exceeded 1 $cd/m^2$, and at 13 V, a current density of 250 $mA/cm^2$ was obtained, and the luminance at that time was 6737 $cd/m^2$.

EXAMPLE 2

A device was prepared in the same manner as in Example 1 except that the thickness of the cathode interface layer was changed to 2 mm. When a direct current voltage was applied to this device, the luminance exceeded 1 $cd/m^2$ at 4 V, and at 14 V, a current density of 250 $mA/cm^2$ was obtained and the luminance at that time was 5797 $cd/m^2$.

COMPARATIVE EXAMPLE 1

A device was prepared in the same manner as in Example 1 except that no cathode interface layer was formed. When a direct current voltage was applied to this device, the luminance exceeded 1 $cd/m^2$ at 4 V, and at 13 V, a current density of 250 $mA/cm^2$ was obtained and the luminance at that time was 3147 $cd/m^2$.

COMPARATIVE EXAMPLE 2

A device was prepared in the same manner as in Comparative Example 1 except that as a cathode material, a commonly employed magnesium/silver co-vapor-deposited film was used. The atomic ratio of magnesium to silver was 10:1. When a direct current voltage was applied to this device, the luminance exceeded 1 $cd/m^2$ at 4 V, and at 13 V, a current density of 250 $mA/cm^2$ was obtained and the luminance at that time was 5578 $cd/M^2$.

COMPARATIVE EXAMPLE 3

A device was prepared in the same manner as in Example 1 except that as a cathode interface layer, germanium oxide (GeO) was used. When a direct current voltage was applied to this device, the luminance exceeded 1 cd/m² at 7 V, and at 14 V, a current density of 250 mA/cm² was obtained and the luminance at that time was 1036 cd/m².

Figure 6:
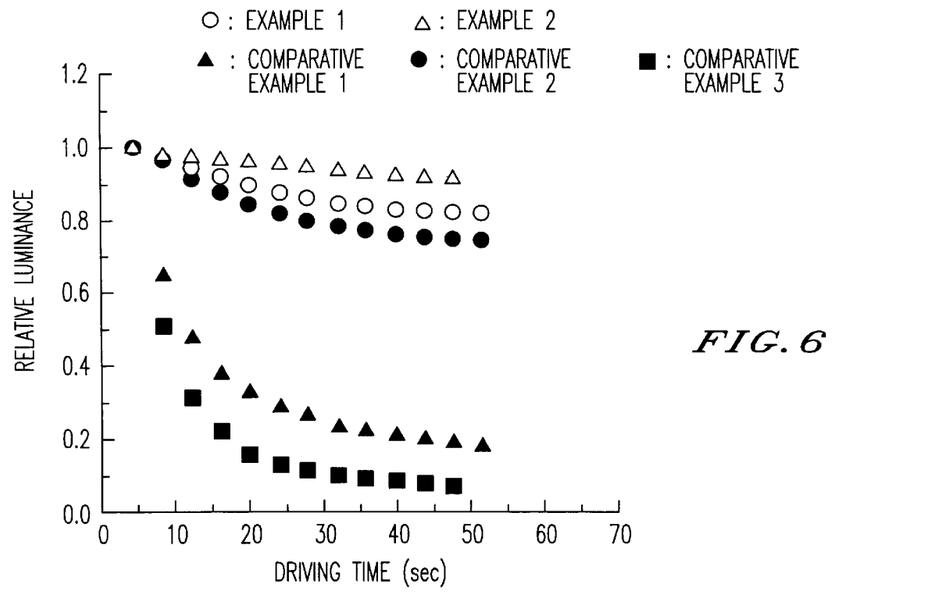
FIG. 6 is a graph showing the luminance characteristics of devices when they were driven at a constant current density of 250 $mA/cm^2$.

The devices of Examples 1 and 2 and Comparative Examples 1, 2 and 3 were driven at a current density of 250 mA/cm², and deterioration of the initial luminance at that time is shown in FIG. 6. The initial luminance in Examples 1 and 2 and Comparative Examples 1, 2 and 3 was 6737 cd/m², 5797 cd/m², 3147 cd/m², 5578 cd/m² and 1036 cd/m², respectively.

Figure 7:
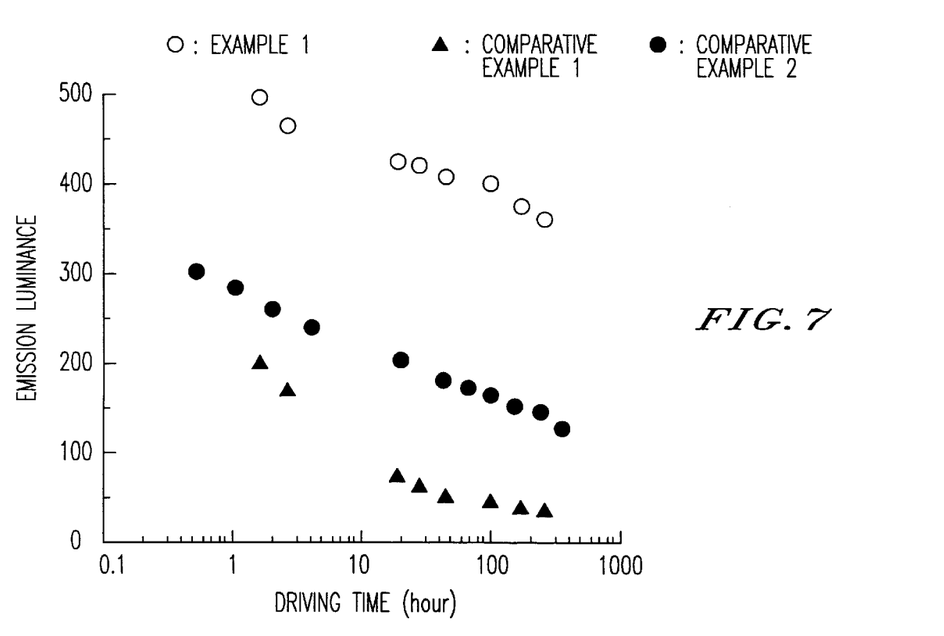
FIG. 7 is a graph showing the luminance characteristics of devices when they were driven at a constant current density of 15 $mA/cm^2$.
Figure 8:
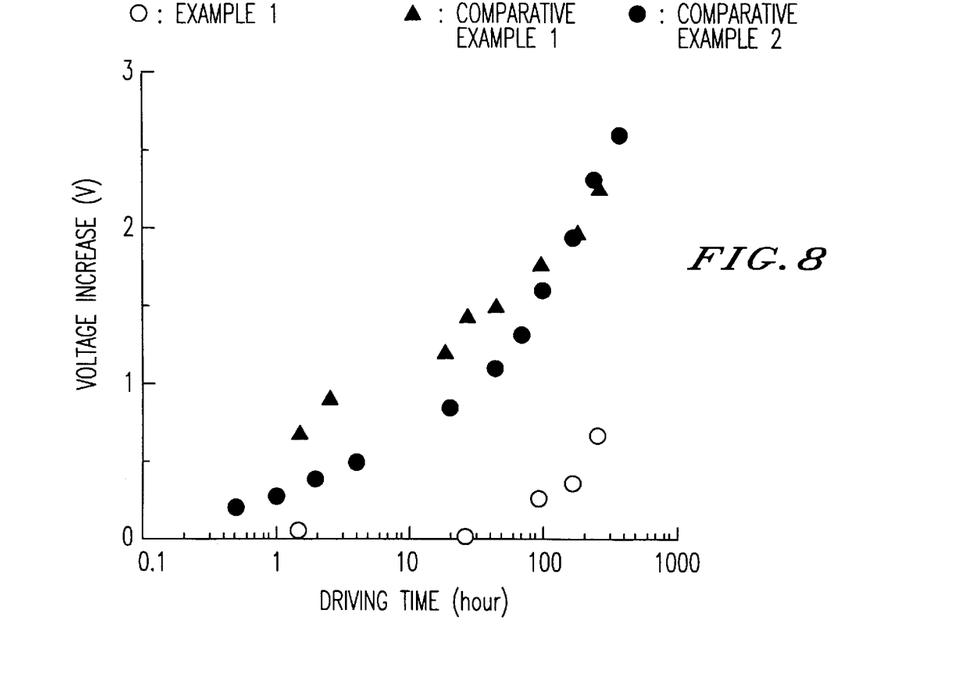
FIG. 8 is a graph showing voltage increases of devices when they were driven at a constant current density of 15 $mA/cm^2$.

Further, the devices of Example 1 and Comparative Examples 1 and 2 were driven at a direct current constant current density of 15 mA/cm², and the changes in luminance of the devices and the changes in the voltages at that time are shown in FIGS. 7 and 8. The initial luminance of the devices of Example 1 and Comparative Examples 1 and 2 were 475 cd/m², 315 cd/m² and 373 cd/m², respectively, and the initial driving voltages were 6.3 V, 8.4 V and 4.9 V, respectively.

EXAMPLE 3

A device was prepared in the same manner as in Example 1 except that the thickness of the cathode interface layer was changed to 0.5 nm, aluminum was vapor-deposited in a thickness of 0.5 nm as the cathode layer, and copper was vapor-deposited thereon in a thickness of 150 nm as the electrical resistance-reduced layer, to obtain a device having the structure of FIG. 4. When a direct current voltage was applied to this device, the luminance exceeded 1 cd/m² at 3 V, and at 6 V, a current density of 250 mA/cm² was obtained and the luminance at that time was 6380 cd/m².

EXAMPLE 4

A device was prepared in the same manner as in Example 1 except that calcium fluoride was used as the cathode interface layer, and the thickness was changed to 0.5 nm. When a direct current voltage was applied to this device, the luminance exceeded 1 cd/m² at 4 V, and at 14 V, a current density of 250 mA/cm² was obtained and the luminance at that time was 6177 cd/m².

EXAMPLE 5

A device was prepared in the same manner as in Example 1 except that calcium fluoride was used as the cathode interface layer, and the thickness was changed to 2 nm. When a direct current voltage was applied to this device, the luminance exceeded 1 cd/m² at 4 V, and at 13 V, a current density of 250 mA/cm² was obtained and the luminance at that time was 6712 cd/m².

EXAMPLE 6

A device was prepared in the same manner as in Example 1 except that calcium fluoride was used as the cathode interface layer, and the thickness was changed to 5 nm. When a direct current voltage was applied to this device, the luminance exceeded 1 cd/m² at 4 V, and at 13 V, a current density of 250 mA/cm² was obtained and the luminance at that time was 6618 cd/M².

Figure 9:
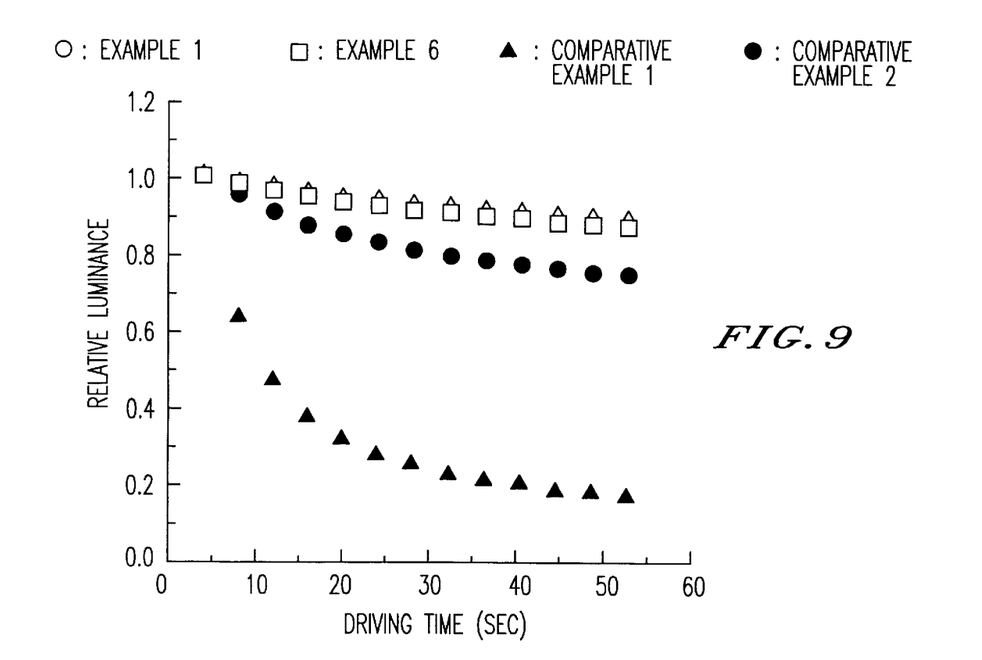
FIG. 9 is a graph showing the luminance characteristics of devices when they were driven at a constant current density of 250 mA/cm².

Further, the devices of Examples 5 and 6 and Comparative Examples 1 and 2 were driven at a current density of 250 mA/cm², and deterioration of the initial luminance is shown in FIG. 9. The initial luminance in Examples 5 and 6 was 6712 cd/m² and 6618 cd/m², and the initial luminance in Comparative Examples 1 and 2 was 3147 cd/m² and 5578 cd/m², respectively.

EXAMPLE 7

A device was prepared in the same manner as in Example 1 except that barium fluoride was used as the cathode interface layer, and the thickness was changed to 0.5 nm. When a direct current voltage was applied to this device, the luminance exceeded 1 cd/m² at 5 V, and at 14 V, a current density of 250 mA/cm² was obtained and the luminance at that time was 5774 cd/m².

EXAMPLE 8

A device was prepared in the same manner as in Example 1 except that barium fluoride was used as the cathode interface layer, and the thickness was changed to 2 nm. When a direct current voltage was applied to this device, the luminance exceeded 1 cd/m² at 4 V, and at 14 V, a current density of 250 mA/cm² was obtained and the luminance at that time was 7310 cd/m².

Figure 10:
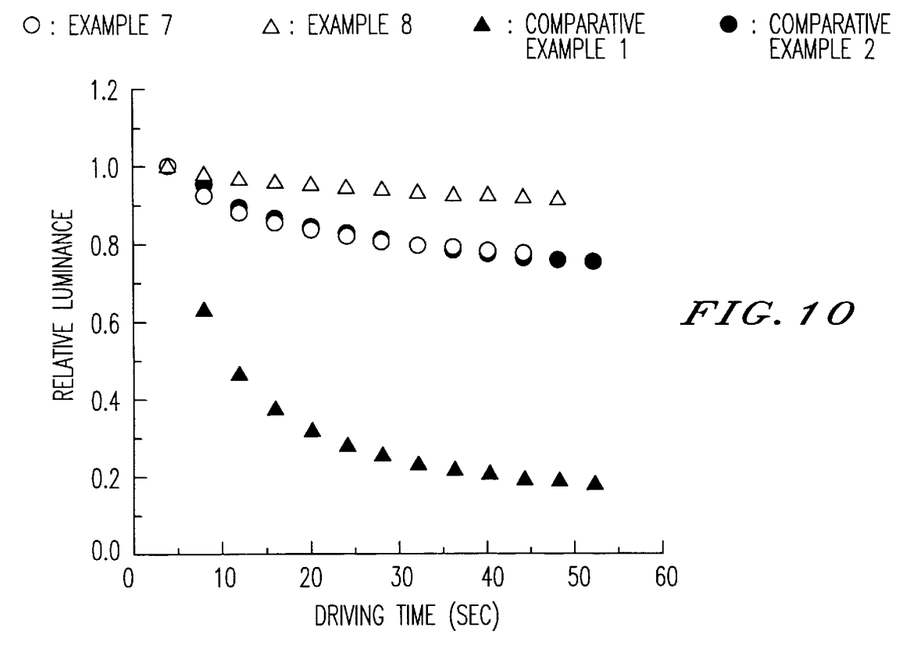
FIG. 10 is a graph showing the luminance characteristics of devices when they were driven at a constant current density of 250 mA/cm².

Further, the devices of Examples 7 and 8 and Comparative Examples 1 and 2 were driven at a current density of 250 mA/cm², and deterioration in the initial stage is shown in FIG. 10. The initial luminance in Examples 7 and 8 was 5774 cd/m² and 7310 cd/m², respectively, and the initial luminance in Comparative Examples 1 and 2 was 3147 cd/m² and 5578 cd/m², respectively.

EXAMPLE 9

A device was prepared in the same manner as in Example 1 except that cerium fluoride was used as the cathode interface layer, and the thickness was changed to 2.0 nm. When a direct current voltage was applied to this element, the luminance exceeded 1 cd/m² at 4 V, and at 13 V, a current density of 250 mA/cm² was obtained and the luminance at that time was 7057 cd/m².

EXAMPLE 10

A device was prepared in the same manner as in Example 1 except that neodymium fluoride was used as the cathode interface layer, and the thickness was changed to 0.5 nm. When a direct current voltage was applied to this device, the luminance exceeded 1 cd/m² at 4 V, and at 13 V, a current density of 250 mA/cm² was obtained and the luminance at that time was 6369 cd/m².

EXAMPLE 11

A device was prepared in the same manner as in Example 1 except that neodymium fluoride was used as the cathode interface layer, and the thickness was changed to 3.0 nm. When a direct current voltage was applied to this device, the luminance exceeded 1 cd/m² at 4 V, and at 15 V, a current density of 250 mA/cm² was obtained and the luminance at that time was 6687 cd/m².

Figure 11:
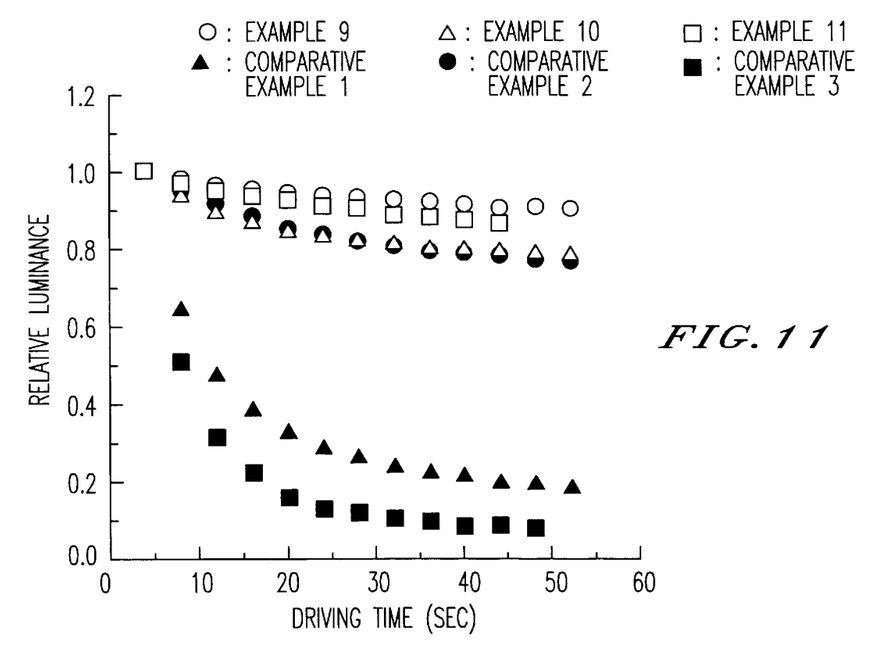
FIG. 11 is a graph showing the luminance characteristics of devices when they were driven at a constant current density of 250 mA/cm².

The devices of Examples 9, 10 and 11 and Comparative Examples 1, 2 and 3 were driven at a current density of current density of 250 mA/cm², and deterioration at the initial stage is shown in FIG. 11. The initial luminance of Examples 9, 10 and 11 was 7057 cd/m², 6369 cd/m² and 6687 cd/m², respectively, and the initial luminance in Comparative Examples 1, 2 and 3 was 3147 cd/m², 5578 cd/m² and 1036 cd/m², respectively.

EXAMPLE 12

A device was prepared in the same manner as in Example 1 except that hexafluoroaluminum sodium ($Na_3AlF_6$) was used as the cathode interface layer, and the thickness was changed to 3.0 nm. When a direct current voltage was applied to this solution, the luminance exceeded 1 cd/m² at 4 V, and at 15 V, a current density of 250 mA/cm² was obtained and the luminance at that time was 6254 cd/m².

EXAMPLE 13

A device was prepared in the same manner as in Example 1 except that hexafluoroaluminum sodium ($Na_3AlF_6$) was used as the cathode interface layer, and the thickness was changed to 0.5 nm. When a direct current voltage was applied to this device, the luminance exceeded 1 cd/m² at 3 V, and at 12 V, a current density of 250 mA/cm² was obtained and the luminance at that time was 7259 cd/m².

Figure 12:
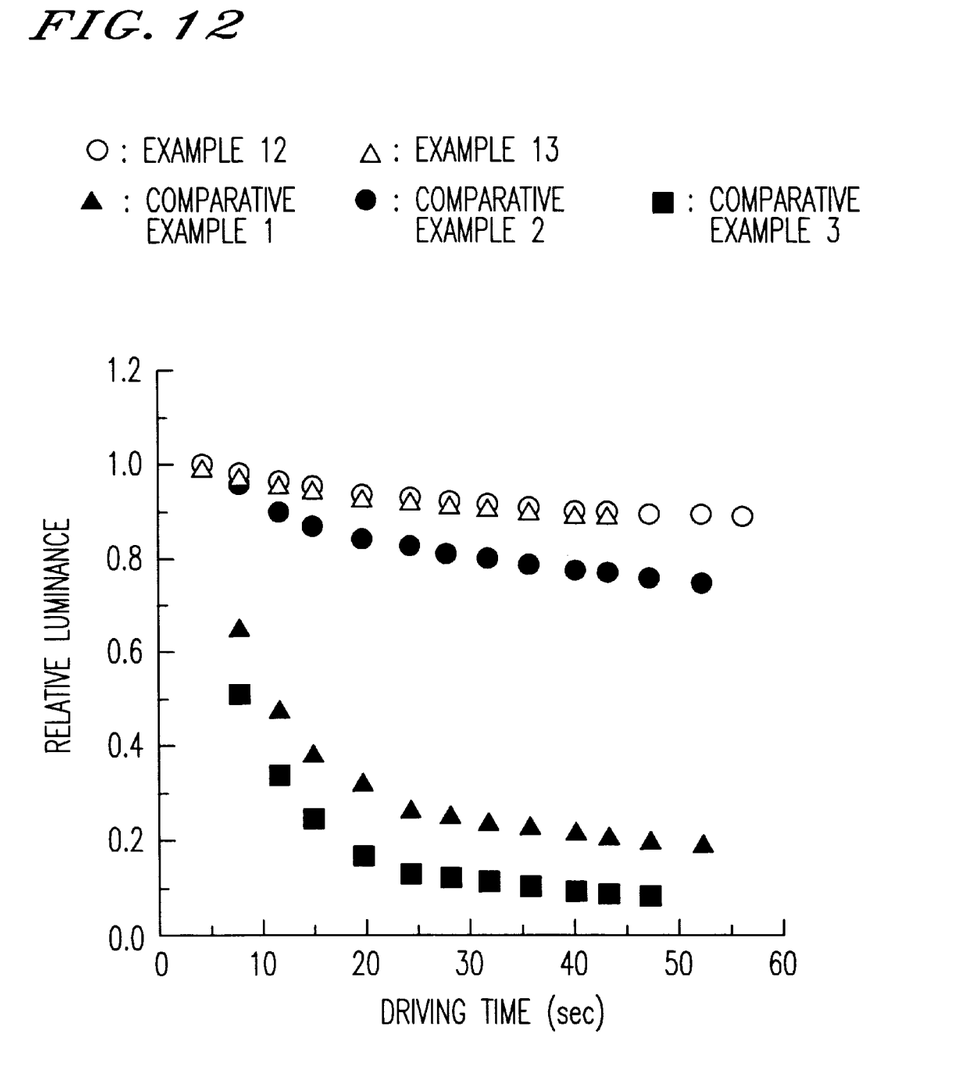
FIG. 12 is a graph showing the luminance characteristics of devices when they were driven at a constant current density of 250 mA/cm².

Further, the devices of Examples 12 and 13 and Comparative Examples 1, 2 and 3 were driven at a current density of 250 mA/cm², and deterioration of the initial luminance is shown in FIG. 12. The initial luminance in Examples 12 and 13 and Comparative Examples 1, 2 and 3 was 6254 cd/m², 7259 cd/m², 3147 cd/m², 5578 cd/m², and 1036 cd/m², respectively.

Now, the characteristics of the devices when fluorides outside the scope of the present invention, were used, are shown as Comparative Examples.

COMPARATIVE EXAMPLE 4

A device was prepared in the same manner as in Example 1 except that aluminum fluoride was used as the cathode interface layer, and the thickness was changed to 0.5 nm. When a direct current voltage was applied to this device, the luminance exceeded 1 cd/m² at 7 V, and at 16 V, a current density of 250 mA/cm² was obtained and the luminance at that time was 1955 cd/m².

COMPARATIVE EXAMPLE 5

A device was prepared in the same manner as in Example 1 except that zinc fluoride was used as the cathode interface layer, and the thickness was changed to 0.5 nm. When a direct current voltage was applied to this device, the luminance exceeded 1 cd/m² at 6 V, and at 16 V, a current density of 250 mA/cm² was obtained and the luminance at that time was 3651 cd/m².

COMPARATIVE EXAMPLE 6

A device was prepared in the same manner as in Example 1 except that vanadium fluoride was used as the cathode interface layer, and the thickness was changed to 0.5 nm. When a direct current voltage was applied to this device, the luminance exceeded 1 cd/m² at 7 V, and at 16 V, a current density of 250 mA/cm² was obtained and the luminance at that time was 2123 cd/m².

In Comparative Examples 4 to 6, the luminance at 250 mA/cm² was at a level of from 2000 to 3500 cd/m², which is about a half of the luminance in Examples.

COMPARATIVE EXAMPLE 7

A device was prepared in the same manner as in Example 1 except that lithium fluoride was used as the material for the cathode interface layer, and the thickness was changed to 0.5 nm. When a direct current voltage was applied to this device, the luminance exceeded 1 cd/m² at 4 V, and at 13 V, a current density of 250 mA/cm was obtained and the luminance at that time was 6621 cd/m².

Figure 13:
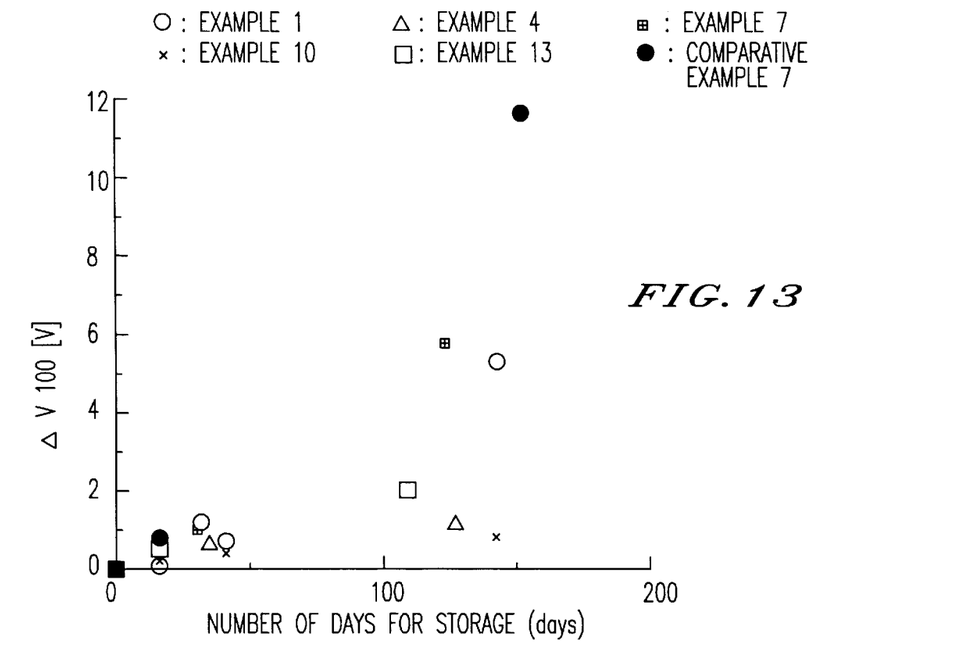
FIG. 13 is a graph showing voltage increases from the initial stage of devices which gave 100 cd/m², when they were stored in a dry nitrogen atmosphere.

The devices of Examples 1, 4, 7, 10 and 13 and Comparative Example 7 were stored in a dry nitrogen atmosphere, and the characteristics of the devices were measured. At that time, a voltage at which the luminance of each device showed 100 cd/m², was obtained, and the difference from that before storage was represented by ΔV100, whereby the voltage increase of each device was investigated, and the results are shown in FIG. 13.

With the device of Comparative Example 7, the luminance was about 6500 cd/m² when the current density was 250 mA/cm², which is substantially the same characteristic as in Examples. However, it was found that the voltage of the device increases substantially over Examples by the storage.

Figure 14:
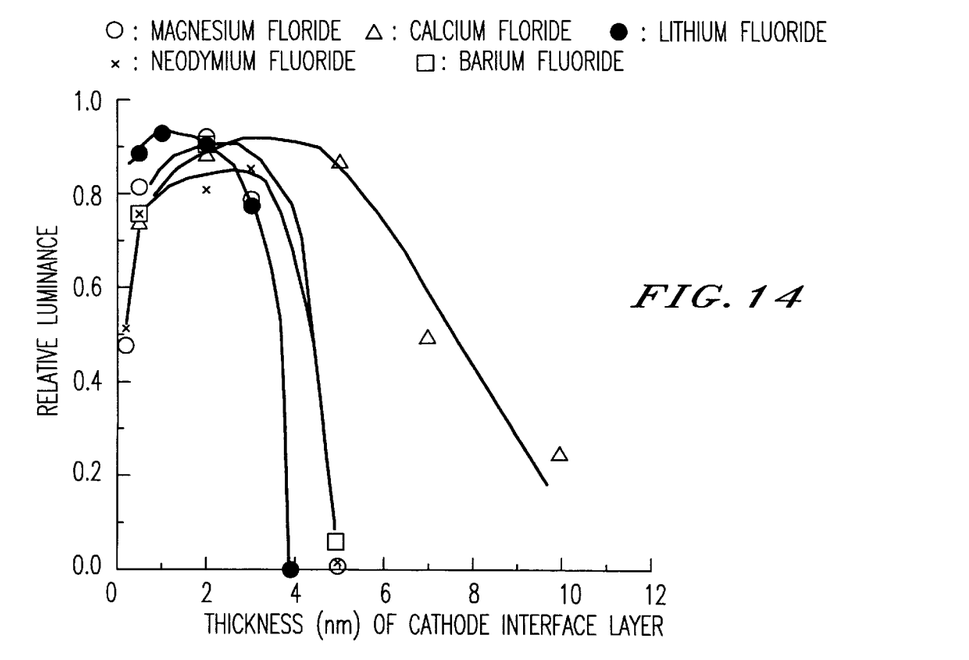
FIG. 14 is a graph showing the relation between the thickness of the cathode interface layer and the relative luminance when a device was driven at 250 mA/cm² for 50 seconds.

Further, the ratio of the luminance when a device was driven at a current density of 250 mA/cm² for 50 seconds, to the initial luminance, was represented by a relative luminance, and FIG. 14 shows the relation between this relative luminance and the thickness of the cathode interface layer. In a case where the fluoride of the present invention is used as a cathode interface layer, the thickness range where the relative luminance is high, is wide as compared with lithium fluoride. This indicates that the process margin is wide when the thickness distribution in the practical process is taken into account, which is expected to provide a substantial merit for mass production.

What is claimed is:

1. An organic electroluminescent device comprising an anode:

a cathode:

an organic luminescent layer between the anode and the cathode; and a cathode interface layer between the organic luminescent layer and the cathode, wherein the cathode interface layer comprises at least one compound selected from a halide of a metal of Group 3A of the Periodic Table, a halide of a metal of a lanthanide series of the Periodic Table, and a complex halide compound of at least two metal elements.

2. The organic electroluminescent device according to claim 1, wherein the complex halide compound is represented by a compositional formula of $A_pM_qX_r$, wherein A is at least one element selected from metal elements of Groups 1A and 2A of the Periodic Table, M is at least one element selected from metal elements of Groups 3A and 3B, X is a halogen atom, and each of p, q and r which are independent of one another, is an integer of from 1 to 20.

3. The organic electroluminescent device according to claim 1, wherein the complex halide compound is represented by a compositional formula of $A_pM_qF_r$, wherein A is at least one element selected from metal elements of Groups 1A and 2A of the Periodic Table, M is at least one element selected from aluminum, gallium, indium and lanthanide metals, and each of p, q and r which are independent of one another, is an integer of from 1 to 20.

4. The organic electroluminescent device according to claim 1, wherein the at least one compound is selected from scandium fluoride, yttrium fluoride, lanthanum fluoride, cerium fluoride, praseodymium fluoride, neodymium fluoride, samarium fluoride. europium fluoride, terbium fluoride, dysprosium fluoride, thulium fluoride, ytterbium fluoride and lutetium fluoride.

5. The organic electroluminescent device according to claim 1, wherein the cathode interface layer has a thickness of from 0.2 to 30 nm.

6. The organic electroluminescent device according to claim 1, wherein the cathode is a metal or an alloy having a work function of at most 4.7 eV.

7. The organic electroluminescent device according to claim 1, wherein the cathode is made of silver, magnesium, aluminum, indium or an alloy containing such an element as the main component.

8. The organic electroluminescent device according to claim 1, wherein the cathode has a multilayer structure of at least two layers, which comprises a first metal layer having a work function of at most 4.7 eV, which is in contact with the cathode interface layer, and a second metal layer having an electrical resistivity of at most 10 $\mu\Omega.cm$, which is laminated on the first metal layer.

9. A method of making an organic electroluminescent device, the method comprising laminating an anode, an organic luminescent layer, a cathode interface layer, and a cathode; and forming the organic electroluminescent device of claim 1.

10. A method of using an organic electroluminescent device, the method comprising providing the organic electroluminescent device of claim 1, and applying an electric field to the organic luminescent layer of the organic electroluminescent device of claim 1.

* * * * *